United States Patent
Guyot et al.

(10) Patent No.: US 9,471,227 B2
(45) Date of Patent: Oct. 18, 2016

(54) IMPLEMENTING ENHANCED PERFORMANCE WITH READ BEFORE WRITE TO PHASE CHANGE MEMORY TO AVOID WRITE CANCELLATIONS

(71) Applicant: HGST Netherlands B.V., Amsterdam (NL)

(72) Inventors: Cyril Guyot, San Jose, CA (US); Robert Eugeniu Mateescu, San Jose, CA (US); Dejan Vucinic, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 160 days.

(21) Appl. No.: 14/332,197

(22) Filed: Jul. 15, 2014

(65) Prior Publication Data

US 2016/0018988 A1    Jan. 21, 2016

(51) Int. Cl.
G06F 3/06 (2006.01)
G06F 12/08 (2016.01)
G11C 14/00 (2006.01)
G11C 13/00 (2006.01)

(52) U.S. Cl.
CPC .......... *G06F 3/061* (2013.01); *G06F 3/065* (2013.01); *G06F 3/0677* (2013.01); *G06F 12/0862* (2013.01); *G06F 12/0893* (2013.01); *G11C 13/0004* (2013.01); *G11C 13/0069* (2013.01); *G11C 14/009* (2013.01); *G06F 2212/602* (2013.01); *G11C 13/0002* (2013.01); *G11C 2207/2236* (2013.01); *G11C 2207/2245* (2013.01)

(58) Field of Classification Search
CPC .......... G06F 12/0246; G06F 3/0679; G06F 2212/202; G06F 2212/214; G06F 3/0613; G06F 3/061; G06F 2212/222; G06F 2212/7211

See application file for complete search history.

(56) References Cited

U.S. PATENT DOCUMENTS

| | | |
|---|---|---|
| 7,471,556 B2 | 12/2008 | Chow et al. |
| 7,773,410 B2 | 8/2010 | Sheu et al. |
| 8,004,884 B2 | 8/2011 | Franceschini et al. |
| 8,068,360 B2 | 11/2011 | Anholt |
| 8,085,584 B1 | 12/2011 | Kale et al. |
| 8,374,040 B2 | 2/2013 | Bivens et al. |

(Continued)

FOREIGN PATENT DOCUMENTS

WO    WO2013101158 A1    7/2013

OTHER PUBLICATIONS

"Improving Read Performance of Phase Change Memories via Write Cancellation and Write Pausing", by Moinuddin K. Qureshi et al., pp. 1-11, 2013 http://citeseerx.ist.psu.edu/viewdoc/download-?doi=10.1.1.154.3505&rep=rep1&type=pdf.

*Primary Examiner* — Reginald Bragdon
*Assistant Examiner* — Thanh Vo
(74) *Attorney, Agent, or Firm* — Joan Pennington

(57) ABSTRACT

A method, apparatus, and storage device are provided for implementing enhanced performance with read before write to phase-change-memory (PCM). Each write to PCM is preceded by a read to avoid write cancellations with urgent reads from nearby locations. For every write, a large block of data is read from PCM, such as an entire partition, prior to the write in PCM. The cache copy of the large block of data is kept in a controller for the duration of write. A read request from the pre-fetched region is provided from the cached copy thereby preventing read interrupt during write operation.

11 Claims, 5 Drawing Sheets

(56) References Cited

U.S. PATENT DOCUMENTS

| | | | | |
|---|---|---|---|---|
| 2004/0117572 A1* | 6/2004 | Welsh | G06F 11/1451 | 711/162 |
| 2007/0255891 A1* | 11/2007 | Chow | G06F 12/0804 | 711/103 |
| 2013/0033929 A1 | 2/2013 | Kim | | |
| 2013/0138875 A1* | 5/2013 | Kamphenkel | G06F 13/1684 | 711/103 |
| 2014/0132616 A1* | 5/2014 | Han | G09G 5/399 | 345/547 |
| 2014/0250268 A1* | 9/2014 | Traut | G06F 12/0862 | 711/113 |

* cited by examiner

IMPLEMENTING ENHANCED PERFORMANCE WITH READ BEFORE WRITE TO PHASE CHANGE MEMORY TO AVOID WRITE CANCELLATIONS

FIELD OF THE INVENTION

The present invention relates generally to the data storage field, and more particularly, relates to a method, apparatus, and storage device for implementing enhanced performance with read before write to phase-change-memory (PCM) to avoid write cancellations with urgent reads from nearby locations.

DESCRIPTION OF THE RELATED ART

Phase-change-memory (PCM) is a promising medium for next generation non-volatile solid-state storage. One of the idiosyncrasies of PCM is the much longer time required to write a bit than to read it; write operations are about fifty times slower than reads.

While a write operation is in progress a larger region of memory of the chip, such as a chip region called a partition, is blocked off from read or write access. This means that a read request from a written-to partition has to wait for the write to complete, which is potentially 50 times longer than usual read latency. Otherwise, the write operation must be aborted for the read to proceed in a timely manner and then the write operation is attempted again later.

A need exists to provide an effective and efficient mechanism for enhanced performance for implementing data write for solid state drives (SSDs), for example, including phase-change-memory (PCM).

In the following description and claims, the term phase-change-memory (PCM) should be broadly understood to include memory devices having a large asymmetry between to read and write latencies, with reads being faster than writes.

SUMMARY OF THE INVENTION

Aspects of the present embodiments are to provide a method, apparatus, and storage device for implementing enhanced performance with read before write to phase-change-memory (PCM). Other important aspects are to provide such method, apparatus, and storage device substantially without negative effect and that overcome some of the disadvantages of prior art arrangements.

In brief, a method, apparatus, and storage device are provided for implementing enhanced performance with read before write to phase-change-memory (PCM). Each write to PCM is preceded by a read to avoid write cancellations with urgent reads from nearby locations. For every write, a large block of data is read from PCM, such as an entire partition, prior to the write in PCM. The cache copy of the large block of data is kept in a controller for the duration of write. A read request from the pre-fetched region is provided from the cached copy thereby preventing read interrupt during write operation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

In accordance with features of preferred embodiments, a method, apparatus, and storage device are provided for implementing enhanced performance including enhanced data write to phase change memory, for example, for solid state drives (SSDs). The enhanced data write is implemented using a read before writing data to the phase change memory of preferred embodiments.

In accordance with features of the preferred embodiments, every write to phase change memory (PCM) is preceded by a read that is kept in the controller for the duration of the write, so that a read request from the pre-fetched region is provided from the cached copy, avoiding read interruption of the write operation.

Figure 1:
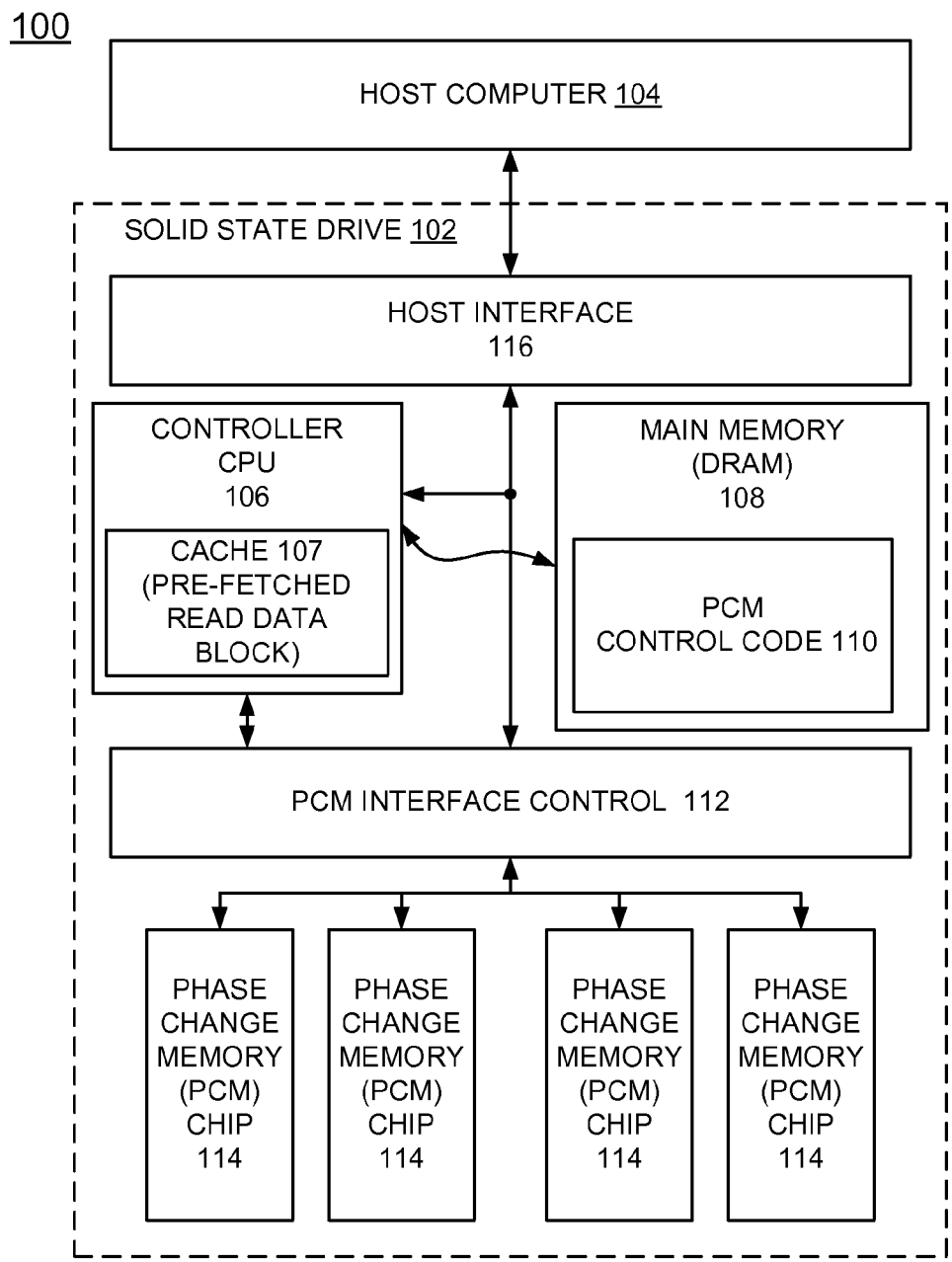
FIG. 1 is a block diagram representation illustrating a system for implementing enhanced performance methods for with read before write to phase change memory, for example, for solid state drives (SSDs) in accordance with preferred embodiments.

Having reference now to the drawings, in FIG. 1, there is shown an example system for implementing enhanced data write methods for phase change memory (PCM), for example, for solid state drives (SSDs) generally designated by the reference character 100 in accordance with preferred embodiments. System 100 includes a solid state drive 102 and a host computer 104. SSD 102 includes a controller central processor unit (CPU) 106 including a cache 107 for storing pre-fetched read data blocks in accordance with preferred embodiments. SSD 102 includes the controller CPU 106 coupled to a main memory or dynamic random access memory (DRAM) 108, a phase change memory (PCM) control code 110, and a phase change memory (PCM) interface control 112.

SSD 102 includes a plurality of phase change memory (PCM) devices or chips 114 coupled to the PCM interface control 112, which are coupled to the controller 106. SSD 102 includes a host interface 116 coupled between the host computer 104, and the controller 106 and the phase change memory (PCM) interface control 112.

Although the example embodiment of system 100 is described in the context of the solid state drive 102, it should be understood that principles of the preferred embodiments advantageously are applied to other types of data storage device including phase change memory (PCM) and various storage arrangements including memory devices having a large asymmetry between to read and write latencies.

System 100 is shown in simplified form sufficient for understanding preferred embodiments. For example, the controller 106 can be fabricated on one or multiple integrated circuit dies, and is suitably programmed to implement methods in accordance with preferred embodiments.

SSD 102 implements enhanced data write for phase change memory (PCM) using a read before write in accordance with preferred embodiments. The controller CPU 106 of SSD 102 includes firmware, such as PCM control code 110 in accordance with preferred embodiments, and is coupled to a PCM interface control block 112. The firmware of controller 106 of SSD 102 is given information with respect to PCM interface control block 112, for example, from PCM control code 110.

Figure 2:
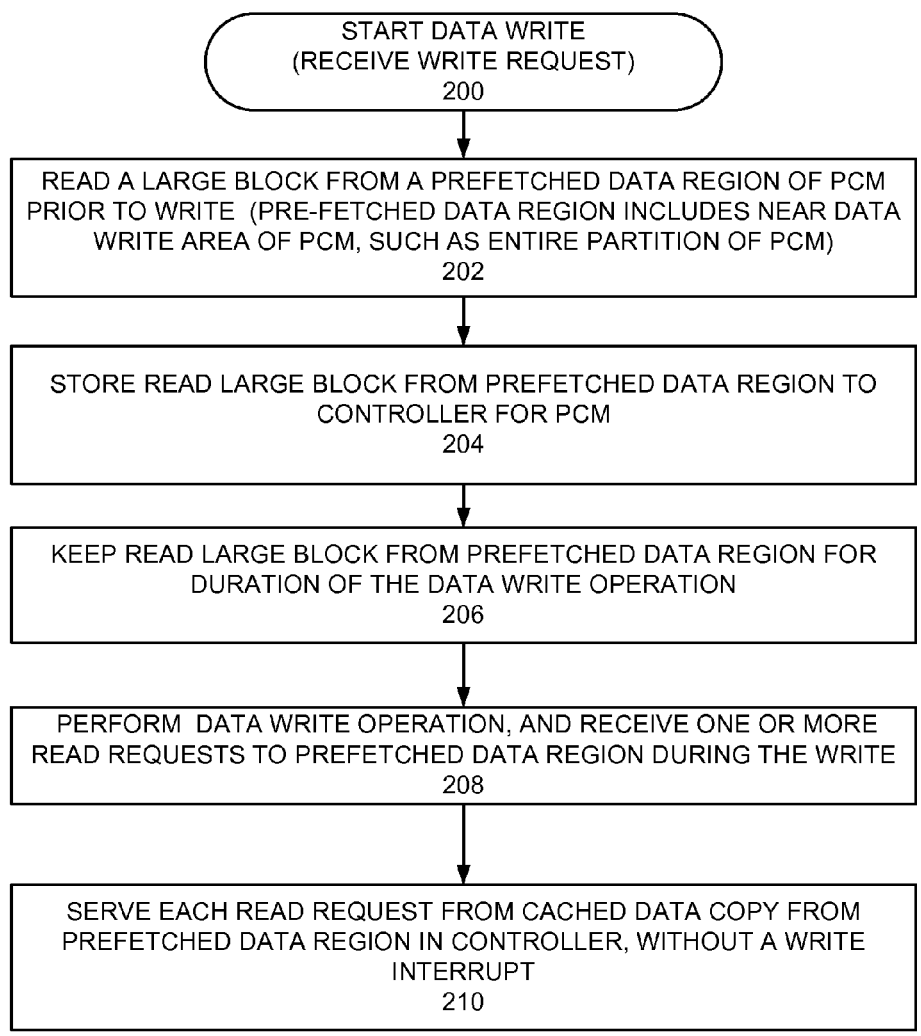
FIG. 2 is a flow chart illustrating example operations of the system of FIG. 1 for implementing enhanced performance read before write to phase-change-memory, for example, for solid state drives (SSDs) in accordance with preferred embodiments.

Referring now to FIG. 2, there is shown a flow chart illustrating example operations of the system of FIG. 1 for implementing enhanced performance including enhanced data write, for example, for solid state drives (SSDs) in accordance with preferred embodiments.

As indicated in a block 200, a data write starts in accordance with preferred embodiments, such as responsive to a received write request. Before writing data to the PCM, a large block of data is read from a pre-fetched data region of PCM prior to the data write as indicated in a block 202.

The read large data block from the pre-fetched data region is stored to the controller for the PCM as indicated in a block 204. As indicated in a block 206, the read large data block is kept for the duration of the write operation. As indicated in a block 208, while performing the data write operation, one or more read requests to the pre-fetched data region optionally is received during the write. Each such received request is served from the cached data copy from the pre-fetched data region in the controller, without a write interrupt as indicated in a block 210 in accordance with features of the preferred embodiments.

Figure 3:
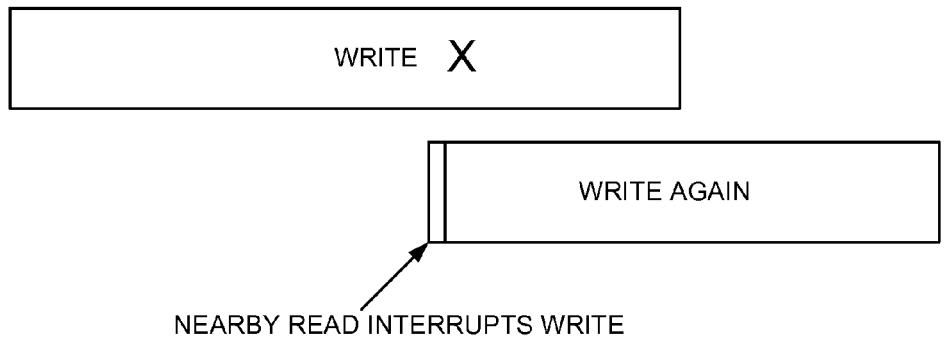
FIG. 3 illustrates a typical prior art data write to some known memory devices.

Referring now to FIG. 3, there is shown a typical prior art data write to some known memory devices. A nearby read interrupts the typical data write, and another write is performed after the nearby read.

Figure 4:
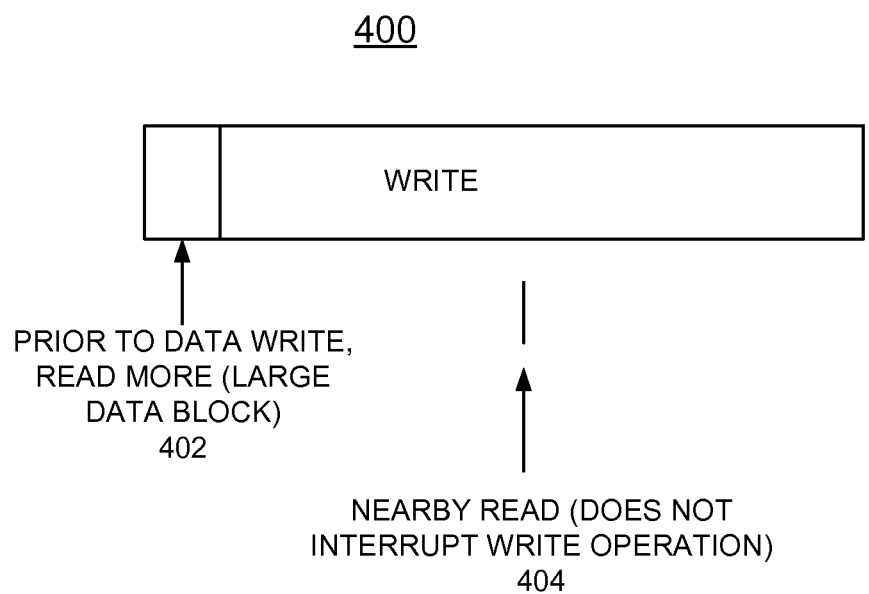
FIG. 4 illustrates a data write to phase-change-memory in accordance with preferred embodiments.

Referring now to FIG. 4, there is shown a data write to phase-change-memory generally designated by the reference character 400 in accordance with preferred embodiments. Prior to the data write, more data is read as indicated at line 402 including a large block of data. During the write operation, a nearby read as indicated at line 404 does not interrupt the write operation.

Figure 5:
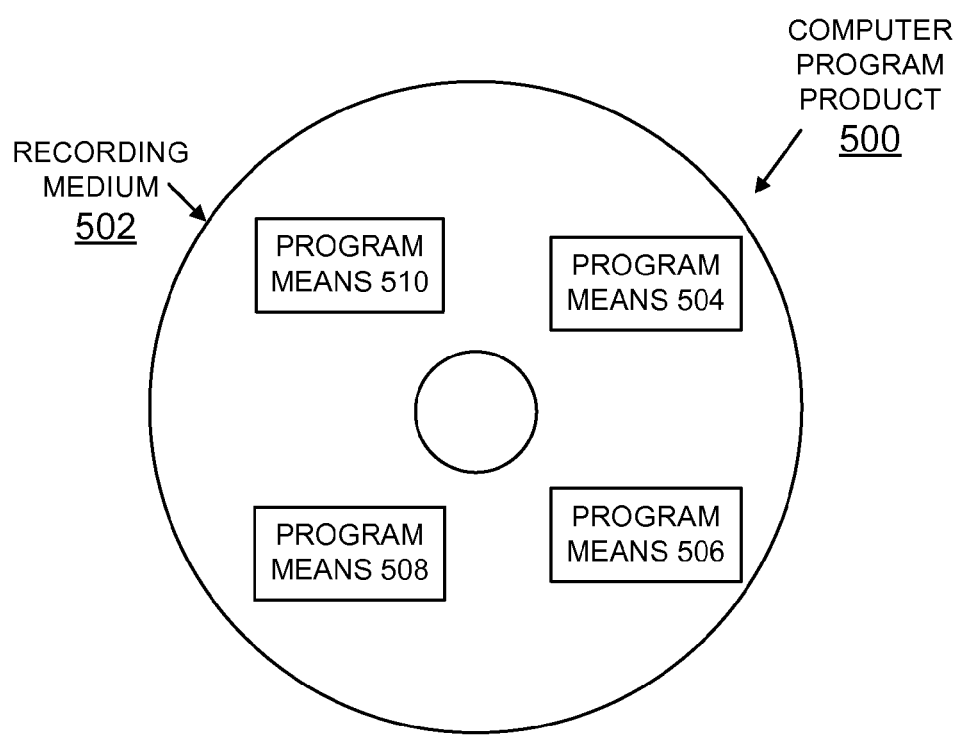
FIG. 5 is a block diagram illustrating a computer program product in accordance with preferred embodiments.

Referring now to FIG. 5, an article of manufacture or a computer program product 500 of the preferred embodiments is illustrated. The computer program product 500 includes a computer readable recording medium 502, such as, a floppy disk, a high capacity read only memory in the form of an optically read compact disk or CD-ROM, a tape, or another similar computer program product. Computer readable recording medium 502 stores program means or control code 504, 506, 508, 510 on the medium 502 for carrying out the methods for implementing enhanced performance for data write to Phase Change Memory (PCM) including a read before write in accordance with preferred embodiments in the system 100 of FIG. 1.

A sequence of program instructions or a logical assembly of one or more interrelated modules defined by the recorded program means or control code 504, 506, 508, 510, direct SSD controller 106 of the system 100 for implementing enhanced performance with data write to PCM of preferred embodiments.

While the present invention has been described with reference to the details of the embodiments of the invention shown in the drawing, these details are not intended to limit the scope of the invention as claimed in the appended claims.

What is claimed is:

1. A method for implementing data write to phase-change-memory (PCM) comprising:
   starting a data write;
   responsive to starting the data write, reading a block of data from a prefetched read data region from the PCM prior to performing the data write to the PCM; said prefetched read data region includes a region near the data write;
   storing the read block of data from the prefetched read data region to a controller for the PCM,
   keeping a cache copy of the read block of data in said controller for the duration of the data write operation;
   responsive to receiving a read request to the prefetched read data region during the data write operation, performing the read request from the cached data copy in the controller, preventing read interrupt during the data write operation without a write interruption; and
   receiving a second read request to the pre-fetched read data region during the write operation, performing the second read request from the cached data copy in the controller, preventing read interrupt during the data write operation.

2. The method for implementing data write as recited in claim 1 wherein starting a data write includes receiving a write request.

3. The method for implementing data write as recited in claim 2 wherein reading the block of data from the prefetched read data region from the PCM includes reading an entire partition from the PCM, responsive to the received write request.

4. An apparatus for implementing data write to phase-change-memory (PCM) comprising:
   a controller;
   said controller starting a data write;
   said controller responsive to starting the data write, reading a block of data from a pre-fetched read data region from the PCM prior to performing the data write to the PCM; said prefetched read data region includes a region near the data write;
   said controller storing the read block of data from the prefetched read data region to said controller for the PCM,
   said controller keeping a cache copy of the block of data for the duration of the data write operation;
   said controller responsive to receiving a read request to the prefetched read data region during the data write operation, performing the read request from the cached data copy in the controller preventing read interrupt during the data write operation, without a write interruption; and
   said controller receiving a second read request to the prefetched read data region during the write operation, said controller performing the second read request from the cached data copy in the controller, preventing read interrupt during the data write operation.

5. The apparatus for implementing data write as recited in claim 4 includes control code stored on a non-transitory computer readable medium, and wherein said controller uses said control code for implementing data write.

6. The apparatus for implementing data write as recited in claim 4 includes said controller receiving a write request and starting the data write.

7. The apparatus for implementing data write as recited in claim 4 wherein said controller reading the block of data from the pre-fetched read data region from the PCM includes said controller reading an entire partition from the PCM, responsive to the received write request.

8. A data storage device comprising:
a phase-change-memory (PCM);
a controller for implementing data write to the phase-change-memory (PCM);
said controller starting a data write;
said controller responsive to starting the data write, reading a block of data from a pre-fetched read data region from the PCM prior to performing the data write to the PCM; said prefetched read data region includes a region near the data write;
said controller storing the read block of data from the prefetched read data region to said controller for the PCM,
said controller keeping a cache copy of the block of data for the duration of the data write operation
said controller responsive to receiving a read request to the prefetched read data region during the data write operation, performing the read request from the cached data copy preventing read interrupt during the data write operation, without a write interruption; and
said controller receiving a second read request to the prefetched read data region during the write operation, said controller performing the second read request from the cached data copy in the controller, preventing read interrupt during the data write operation.

9. The data storage device as recited in claim 8, includes control code stored on a non-transitory computer readable medium, and wherein said controller uses said control code for implementing data write.

10. The data storage device as recited in claim 8, includes said controller receiving a write request and starting the data write.

11. The data storage device as recited in claim 8, wherein said controller reading the block of data from the pre-fetched read data region from the PCM includes said controller reading an entire partition from the PCM, responsive to the received write request.

\* \* \* \* \*